United States Patent [19]

Fisher et al.

[11] Patent Number: 4,847,558
[45] Date of Patent: Jul. 11, 1989

[54] NON-DESTRUCTIVE METHOD AND APPARATUS USING DC ERASE FIELD FOR MAGNETIC MEASUREMENT OF RECORDING DISC

[75] Inventors: Robert D. Fisher, Santa Clara County; Jason L. Pressesky, San Mateo County, both of Calif.

[73] Assignee: Seagate Technology, Inc., Scotts Valley, Calif.

[21] Appl. No.: 237,677

[22] Filed: Aug. 25, 1988

Related U.S. Application Data

[63] Continuation of Ser. No. 69,184, Jul. 2, 1987, abandoned.

[51] Int. Cl.$^4$ ............... G01R 33/12; G01N 27/72; G11B 5/02; G11B 27/34
[52] U.S. Cl. ........................... 324/212; 360/25; 369/58
[58] Field of Search ................. 324/210–212, 324/222; 360/25, 31, 66; 369/53, 58

[56] References Cited

U.S. PATENT DOCUMENTS

| 3,535,622 | 10/1970 | Cannon et al. | 324/212 |
| 3,562,635 | 2/1971 | Parker | 324/212 |
| 3,812,529 | 8/1972 | Yoichi | 324/212 X |

FOREIGN PATENT DOCUMENTS

| 0110072 | 5/1986 | Japan | 324/212 |

Primary Examiner—Gerard R. Strecker
Attorney, Agent, or Firm—Flehr, Hohbach, Test, Albritton & Herbert

[57] ABSTRACT

This invention relates to an instrument or device capable of performing a non-destructive evaluation of the major magnetic properties of a recording disc member that determines the basic digital recording performance of said member. These measurements include the non-destructive evaluation of parameters including coercive force and remanence-thickness product of the recording member as a function of the circumference and/or the radius of the recording member. These parameters determine the signal amplitude as well as the frequency response of the disc member.

13 Claims, 7 Drawing Sheets

TYPICAL HYSTERESIS LOOP OF A MAGNETIC MATERIAL
INDICATING SATURATION MAGNETIZATION (Ms), REMANENCE (Mr)
AND COERCIVE FORCE (Hc)

TYPICAL HEAD-MEDIA INTERFACE CONFIGURATION

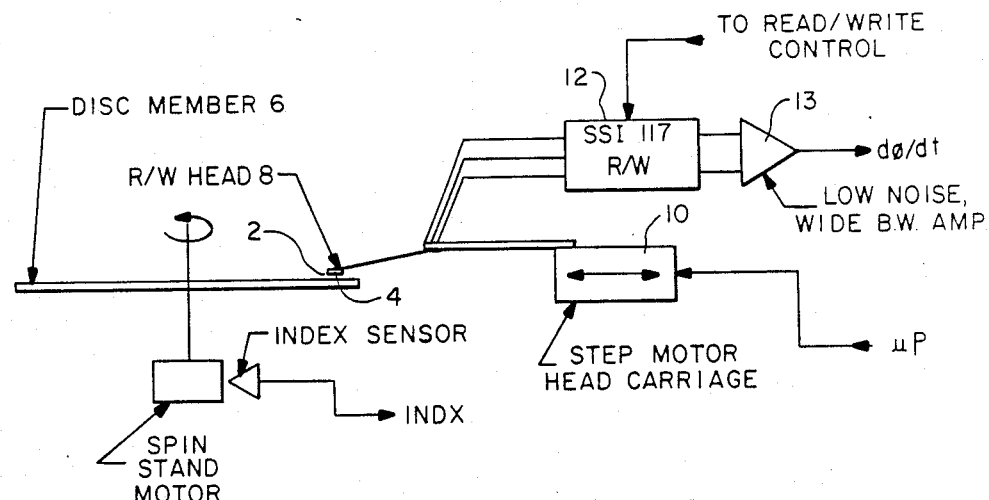
FIG.-3
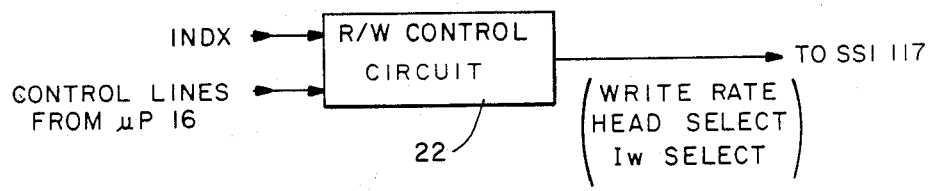
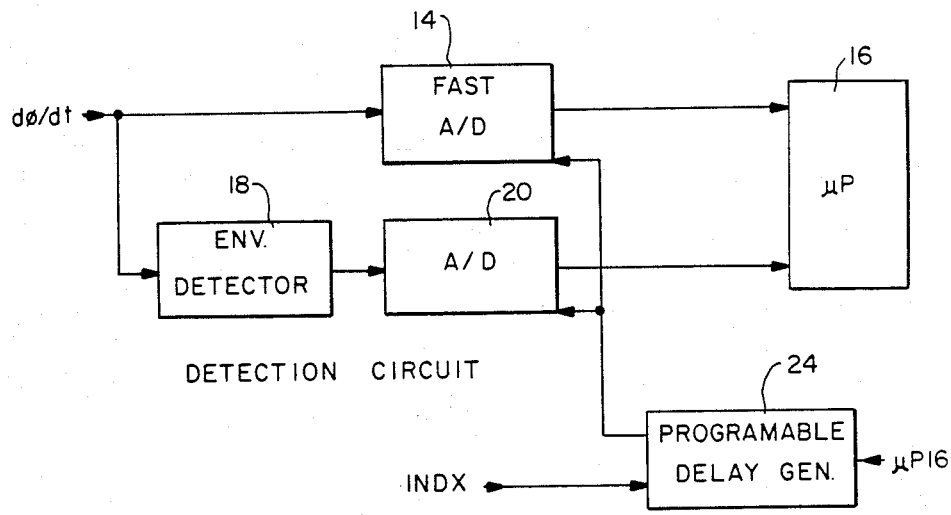
FIG.-4

R/W HEAD ERASE EFFICIENCY AS A FUNCTION OF
DC ERASE CURRENT AT THE -6 dB SIGNAL VALUE

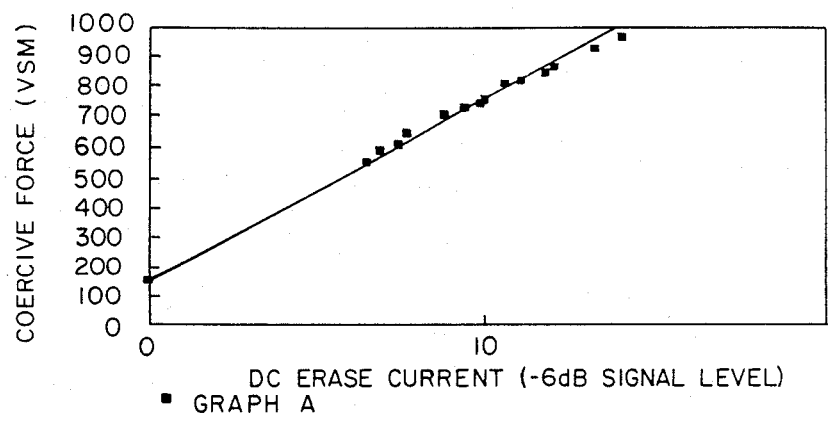
COERCIVE FORCE AS A FUNCTION OF DC ERASE CURRENT AT -6dB CURRENT LEVEL CORRESPONDING TO COERCIVE FORCE
FIG. −7
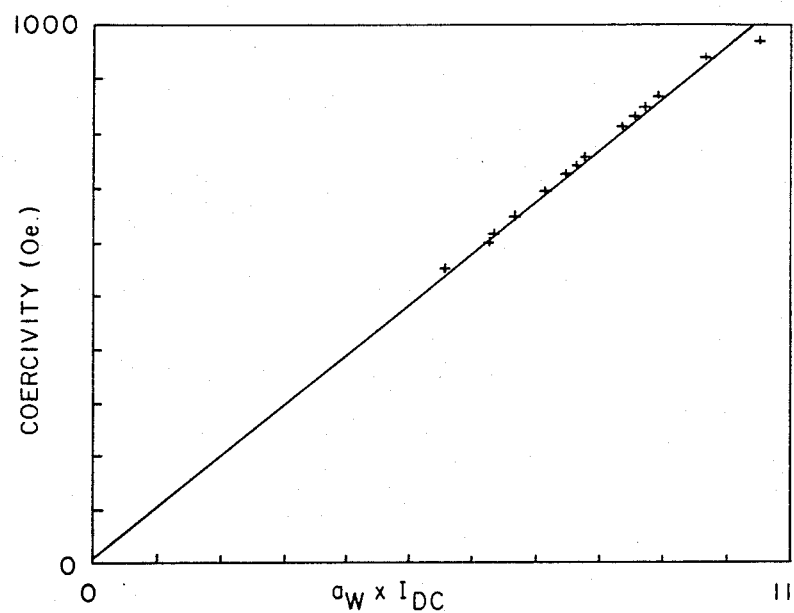
COERCIVE FORCE AS A FUNCTION OF R/W HEAD EFFICIENCY ($a_w$) MULTIPLIED BY DC ERASE CURRENT VALUE AT -6dB SIGNAL LEVEL
FIG. −8

NON-DESTRUCTIVE METHOD AND APPARATUS USING DC ERASE FIELD FOR MAGNETIC MEASUREMENT OF RECORDING DISC

This is a continuation of application Ser. No. 069,184, filed July 2, 1987, abandoned.

BACKGROUND OF THE INVENTION

1. Field of the Invention

This invention is directed to the field of non-destructive testing of magnetic media for use in disc drives, and more particularly measurement of coercive force and remanence-thickness product as a function of circumference and/or radius of the recording member. The data can be used to adjust process parameters in manufacturing magnetic recording members.

The recording performance of a magnetic recording member is primarily determined by the magnetic properties, specifically the coercive force, remanence, and thickness of the recording member. These magnetic properties determine the signal amplitude, frequency response, resolution, and overwrite characteristics of recording disc members.

Currently, there are two common, methods for measuring these properties, a vibrating sample magnetometer and a hysteresis tester. The former measures the magnetization as a function of the applied field, whereas the latter measures the flux density as a function of field. In order to obtain the fundamental magnetic properties using this equipment, namely, the coercive force, remanence, or remanence-thickness product, as well as the saturation magnetization, it is necessary to cut or define a finite element from the recording member for measurement purposes. Consequently, both techniques are destructive. In addition, both techniques or measurement methods determine the average value of the coercive force, and/or the remanence of the sample, or the finite element which was removed from the recording member for evaluation rather than the values for a specific location(s) on the surface of the member. In addition, such methods are not practical for thin film media typically utilized in advanced digital recording systems due to inadequate magnetic volume.

A typical hysteresis loop or B-H loop is shown in FIG. 1, which describes the typical hysteresis characteristics required for evaluation of a sample. Typical digital recording media consists of magnetic oxide (gamma iron oxide) dispersed in a non-magnetic organic binder.

Thin film media are known to exhibit superior recording performance relative to particulate oxide media as a result of inherent higher remanence and coercive force values. However, the magnetic properties of oxide and thin film media are determined to a large degree by the quality of the particulate dispersion, degree of orientation of the oxide particulate particles, and the particle size. The magnetic properties of thin film media are determined by the deposition process parameters, e.g., in the case of sputtered films, process temperature and substrate type are of particular significance, as well as the sputtering pressure. Consequently, the magnetic properties of a recording member are determined in situ or after the fact. Currently, manufacturing must rely on the recording performance to monitor progress and/or adjust process parameters to conform to recording specifications.

Therefore, a need exists for a method of quickly determining the magnetic properties, particularly coercive force and the remanence-thickness product, in a non-destructive manner.

An object of this invention is to provide a method and apparatus for measuring the coercive force as well as the remanence-thickness product in a non-destructive manner.

A related objective of this invention is to provide method and apparatus for determining the values of the above parameters at any location on the disc surface with a minimum degree of averaging or minimum spatial resolution. This provides precise measurement of the coercive force and remanence-thickness product over the disc surface, which is necessary for determination of the recording performance and manufacturing process control.

BRIEF DESCRIPTION OF THE INVENTION

An object of this invention is to provide method and apparatus for measuring the coercive force and/or variations in coercive force around any recorded track or cylinder on a disc member or measurement of the coercive force at any radial position of the disc member.

A further object is to allow measurement of the remanence thickness product on any recorded track or cylinder and at any radial position. Consequently, the invention allows determination of the basic magnetic properties that determine the recording performance of the disc member. Additionally, repeating measurements of the coercive force and/or remanence thickness product at different radial locations provides a means of obtaining a surface map of the basic magnetic variations within a disc recording member.

These and other objectives of this invention are accomplished by writing a low frequency or long wavelength recording pattern on a disc and measuring the signal amplitude as a function of DC erase current to determine the coercive force; subsequent calculation of the isolated half pulse width allows determination of the remanence-thickness product of the disc media. The coercive force and remanence-thickness product can thus be determined as a function of track circumference and track radius, thereby obtaining or determining variation in coercive force and/or remanence-thickness product of the disc member. This data can be used to adjust the parameters of the manufacturing process to provide consistent product output.

An alternative method for measurement of the coercive force and/or isolated pulse width is to measure the area of the isolated pulse at long wave lengths, i.e., a low frequency write pattern, e.g. 500 KHz. The coercive force may then be determined by the DC erase current magnitude which decreases the area of the pulse by 50 percent, and the remanence-thickness product is determined from the isolated half pulse width.

The features and advantages of this invention will be better understood reviewing the following detailed description given with reference to the following figures.

BRIEF DESCRIPTION OF THE DRAWINGS

FIG. 3 illustrates the elements of the apparatus of this invention;

FIG. 4 is a block diagram of some of the electronics of this invention;

FIG. 7 illustrates coercive force as a function of DC erase current at −6 dB current level;

FIG. 8 illustrates coercive force as a function of R/W head efficiency ($a_w$) multiplied by DC erase current value at −6 dB signal level;

DESCRIPTION OF A PREFERRED EMBODIMENT

Figure 2:
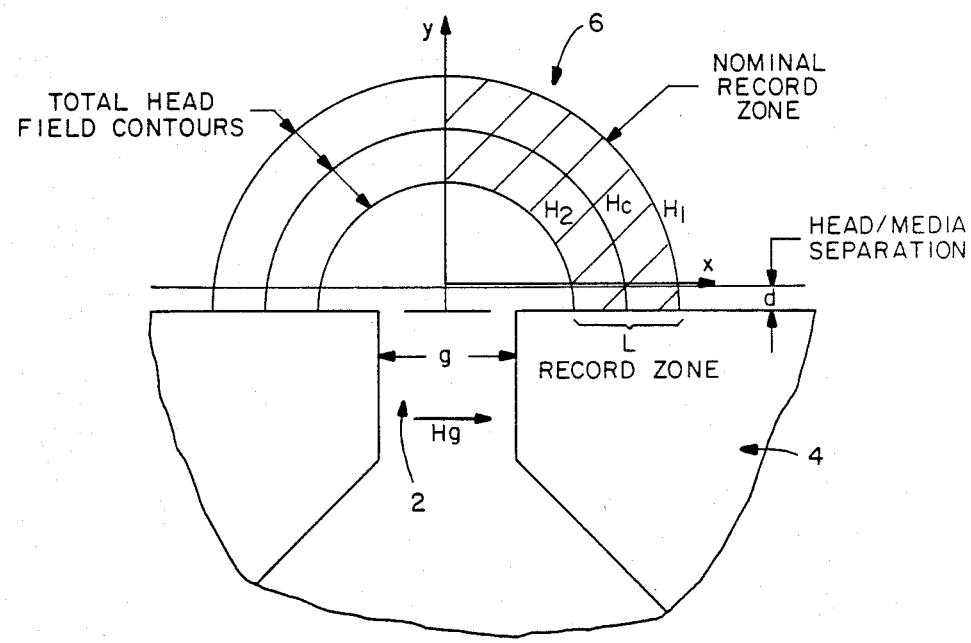
FIG. 2 illustrates a typical head-media interface configuration.

The underlying theory of this invention can be understood by the following derivation given with reference to FIG. 2. As shown therein, to test the coercivity and remanence of magnetic recording media, a standardized test head 4 is used. The air gap 2 in the recording head 4 is brought into close proximity with the magnetic recording medium 6. When the head is driven by a magnetomotive force (NI), the leakage flux in the vicinity of the gap 2 saturates the thin layer of magnetizable material. Hence, when the medium moves away from the head field it retains a remanent magnetization determined by head field magnitude, the magnetic characteristics of the media, and the self-demagnetization. The head field in the vicinity of the gap can be expressed as $$H = Hg(g/l_a) \quad (1)$$

in which Hg is the homogeneous field in the gap, g is the gap length, and $l_a$ the length of the flux path in the air. As $l_a$ is a semicircle, we can substitute $l_a = \pi r$ where $r = (x^2+y^2)$ and x, y are scalar distances as shown in FIG. 2. Thus:

$$H = \frac{Hg}{\pi(x^2 + y^2)} 1/2 \quad (2)$$

However, this equation breaks down in immediate vicinity of the gap because when $x=y\to 0$, $H\to\infty$. Although the geometry of the idealized head is simple, a precise analytical solution of this equation is not obtainable in closed form. An analytical approximation of the head field as a function of distance has been described by Karlquist (Trans. Royal Institute of Technology, Stockholm, Sweden, No. 86, 1954) and generally expressed as $$Hx_{x,y} = \frac{Hg}{\pi}\left[\arctan\frac{(g/2 + x)}{y} + \arctan\frac{(g/2 - x)}{y}\right] \quad (3)$$

where g is the gap length, x is distance from center of gap parallel to the head face, y is the perpendicular distance from the head face (y is equivalent to the head media spacing plus ½ the media thickness). Consequently, the write field as a function of the coordinates x, y as shown in FIG. 2 may be determined providing the homogeneous gap field (Hg) is known. The homogeneous field inside the gap may be expressed as:

$$Hg = \frac{0.4 \pi N I a_w}{g} \quad (4)$$

If the read/write head is ferrite, it seems well established that when the deep gap record field (Hg) exceeds ½ of the ferrite saturation flux density (Bs/2) the gap corners start to saturate (F. Jeffers, et al., IEEE Trans. on Magnetics, Vol. Mag. 16, No. 6, p. 1146, 1982). This reduces the head permeability from approximately 1000 to 50, which reduces the head efficiency $a_w$ since the head efficiency is related to the core permeability, i.e., $a_w = R_g/(R_g+R_c)$. Rc, the core reluctance is determined by the expression $$R_c = 1/u \, \Sigma \, (1c/Ac)$$

where $A_c$ is the cross section of the core and $1c$ is the subsequent core length corresponding to Ac. Consequently, the recording performance at short wave lengths is drastically affected due to the reduction in permeability as well as a decrease in the head field gradient. The saturation current for a given R/W head may be determined from Equation 4 by substituting the value of Hg, gap length, efficiency and turns. Consequently, for a MnZn Ferrite head (Winchester type) with a gap of 45 microinches with 19 turns, and an efficiency of (1), the minimum saturation current may be determined as:

$$Is = \frac{2.54 \, (2500) \, 45 \times 10^{-6}}{(0.4)(3.14)(19)} = 11.9 \text{ milliamperes}$$

Substitution of Equation 4 into Equation 3, results in an expression for the longitudinal recording field as a function of the distance from the gap which may be expressed as shown below with "x" being equivalent to the distance along the face of the recording gap and "y" the perpendicular distance from the gap.

$$Hx = \quad (5)$$

$$\frac{0.4 \, N I a_w}{g}\left[\arctan\frac{(g/2 + x)}{y} + \arctan\frac{(g/2 - x)}{y}\right]$$

Hence, it should be emphasized that the expression for determining the coercive force ($Hc=Hx_{0,y}$) is given by:

$$Hx_{0,y} = \frac{0.8 \, N I a_w}{g} \arctan g/2y \quad (6)$$

However, the precise value of $a_w$ is not known especially as a function of frequency as well as the simple fact that $a_w$ is dependent on head geometry(Rc, the core reluctance). Therefore, it is necessary to determine the value of $a_w$ utilizing a media with a known coercive force value.

$$H_{x(0,y)} = \frac{0.8\, a_w\, N\, I\, \arctan(g/2y)}{g} = Hc \text{ (known media)} \quad (7)$$

$$a_w = \frac{g\, Hc \text{ (known media)}}{0.8\, N\, I\, \arctan(g/2y)}$$

Consequently, the coercive force of an unknown media may be determined from Equation 6 since $a_w$ is obtained from the calibration of a standard disc. Determination of the remanence-thickness product for thin film media simply requires a measurement of the isolated pulse width which may be determined directly or by integrating the area beneath an isolated transition pulse as given by:

$$Ap = 2 \int_{T_0}^{T_1} \frac{Ep}{1 + (t/T_{50})^2} dt$$

or $$Ap = 2Ep\, T_{50} \int_{t=0}^{t=\infty} \frac{1}{1 + (t/T_{50})T_{50}} dt$$

where:
T50 = half pulse width of isolated transition (time)
Ep = maximum amplitude of the isolated pulse (volts)
t = time in secs.
Consequently, $$Ap = \pi Ep\, T50 \quad (8)$$

$$T50 = Pw50/\text{Velocity} \quad (9)$$

$$Pw50 = \text{Velocity } Ap/Ep\pi \quad (10)$$

Determination of the remanent-thickness product is then calculated from the known isolated half pulse width on the following basis:

$$Pw50 = [g^2 + 4(a + d)^2]^{1/2} \quad (11)$$

$$a = [4.62\, Mr\, T\, d/Hc]^{1/2} \quad (12)$$

where:
d = distance of separation between media and head or the flying height
g = R/W head gap length
a = transition parameter Therefore, substituting into Equation (11) and solving for the remanence-thickness product results in the expression for MrT as a function of coercive force (Hc), isolated half pulse width (Pw50), R/W head gap length (g), and distance of separation or flying height (d), i.e.:

$$MrT = \frac{Hc\, [0.5\, (Pw50)^2 - g^2)^{1/2} - d]^2}{4.62\, (d)} \quad (13)$$

The equipment or test stand utilized for measuring the coercive force and/or remanence-thickness product is shown in FIGS. 3 and 4. The equipment consists of the member to be evaluated 6; the R/W head and arm assembly 8 including head 4 which records at gap 2; R/W head positioning carriage 10 to position gap 2 to allow measurements as a function of radii; and a R/W amplifier 12, e.g., an SSI 117 chip. The output $d\phi/dt$ of the R/W amplifier 12 is coupled directly through an a/d converter 14 to a microprocessor 16. The same output is connected through a peak or envelope detector 18 to second a/d converter 20. To relate the position of the gap 2 to the data being received, a R/W control circuit 22 and programmable delay generator 24 both receive a common INDX signal. R/W control 22 controls amplifier 12 to read and record information on medium 6. Programmable delay generator 24 responds to the same INDX signal to cause the readback data from selected points on the disc to be read and stored.

Figure 13:
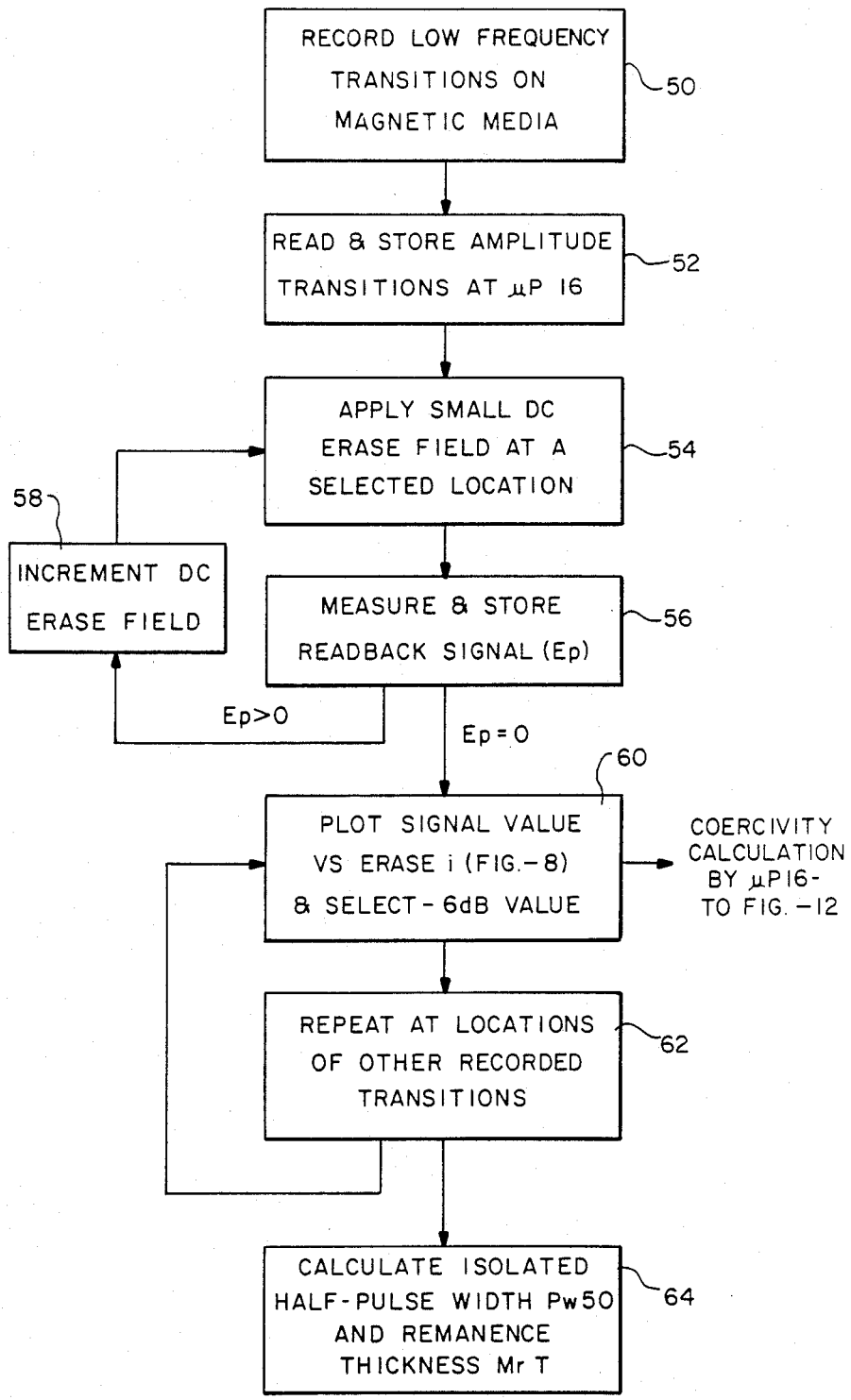
FIG. 13 is a flow chart of the measurement and computation procedures used in practicing the method of the invention.

In order to measure the coercive force of the disc member, the following test sequence is initiated and controlled by microprocessor 16; necessary programming is well within the skill of the state of the art and is not disclosed herein in detail. The outline of the steps to be followed appears in FIG. 13.

(1) A sequence of isolated transitions (low frequency, i.e., long wavelength) is recorded (step 50) at optimum write current around the circumference of the disc from the outside track to the inside track using head 8 and control circuit 22. This puts the tracks of disc 6 in a state of magnetization where there are an equal number of magnetic regions facing in positive and negative directions (transitions). The transitions are spaced widely enough so that they do not interfere with each other due to the low frequency write. A signal ($d\phi/dt$) is induced in the head 8 by the magnetic transitions as the transitions move past the head. The amplitude of this signal is digitized at converter 14 and stored 52 as a value (Ep) by microprocessor 16.

(2) A DC erase field is applied 54 by sourcing a small amount of current through the recording head 8 (the magnitude of this field is determined by Eq. 6).

(3) The amplitude of the readback signal is again measured and stored 56.

(4) The DC erase field applied through amplifier 12 and head 8 is incremented 58 by a small amount, and steps 2 and 3 are repeated. An alternative method is that the DC erase field applied through amplifier 12 and head 8 be incremented only after rewriting with optimum write current step 1. Steps 2, 3 and 4 are repeated until the signal has decreased to essentially zero signal level and the signal amplitude is plotted as a function of the write field erase magnitude and/or write erase current.

Figure 1:
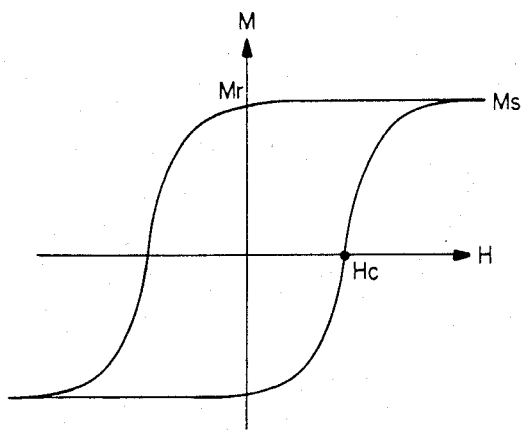
FIG. 1 is a typical hysteresis loop of a magnetic material illustrating saturation magnetization (Ms), remanence (Mr) and coercive force (Hc)

(5) The coercivity of the disc is defined as the magnitude of the DC erase field at a 50% loss in signal value, i.e., the −6 dB signal level versus DC erase current value (DC field) 60. This is analogous or equivalent to the coercive force obtained from the hysteresis loop (M-H loop) measured on a vibrating sample magnetometer, i.e., the field required to reverse half the magnetization (see FIG. 1). In the M-H loop, the coercivity is defined as the field required to take the sample from a state of saturation to a state of zero magnetization. However, in a state of zero magnetization, the material consists of a multitude of magnetic domains, of which there are an equal number in the positive and negative directions, thereby cancelling themselves and yielding a total moment of zero. In the recording situation described, only the transitions contribute to the signal, so the situation is somewhat different. Regions whose magnetization are aligned with the direction of the applied DC field (erase field) are stable, since they are saturated in that direction to begin with. The DC erase affects only those regions whose direction of magnetization is opposed to the applied DC erase field. Therefore, the field required to accomplish a 50% reduction is signal (50% switching of allowed domains) is equivalent to the coercive force.

(6) In practice, the field increments used in steps 2–4 are typically 50 Oe. To overcome this limitation of field resolution, the program follows known mathematical procedures that are well known to a person of skill in the art to perform an interpolation between the data points that bracket the 50% signal loss point. This is sufficient to give a resolution of 1.0 Oe and a precision of 3.0 Oe on a 650 Oe disc member. In order to obtain information about coercivity variations along the recorded track (azimuthal variations), a programmable delay is used in conjunction with the amplitude detector to provide an array of measurements at different angular positions along the track with respect to some fixed index. For a given array of measurements, the principles of finding the value of the coercive force remain the same. Additionally, one can repeat the measurement at different radial locations 60, thereby obtaining a surface ma of coercivity variations over the disc surface.

Example of Calibration

Figure 5:
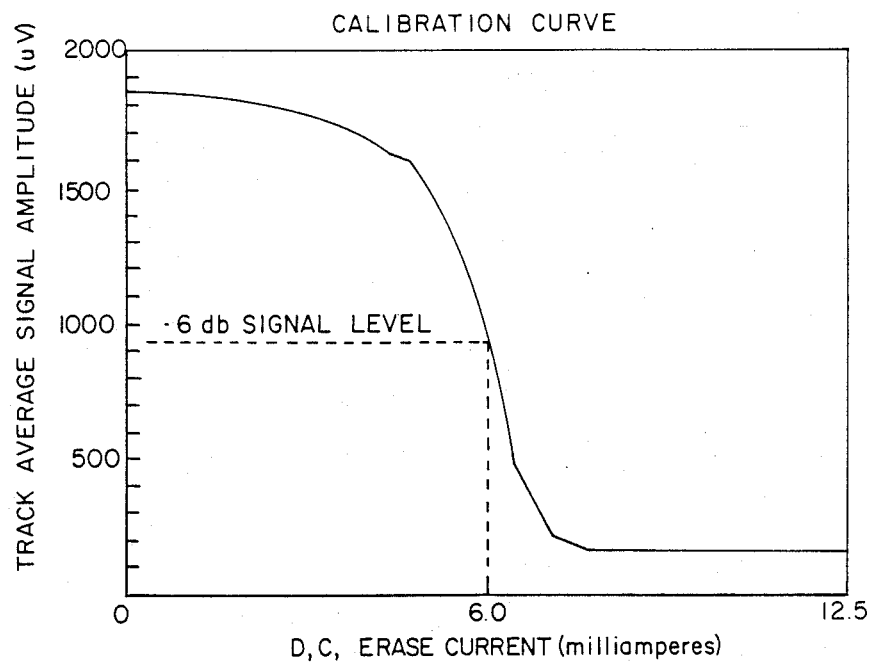
FIG. 5 illustrates calibration curve for the equipment of this invention.

A known disc member with a thickness of 4.0 microinches (determined by X-ray fluorescence analysis) and a known coercive force of 620 Oe as determined by a calibrated Vibrating Sample Magnetometer was utilized as the standard disc. The standard read/write head consisted of a MnZn Ferrite head with a gap length of 40 microinches, track width of 0.72 mils, a flying height of 19.4 microinches at a disc radius of 1.8 inches (5¼" disc) and with 19 turns bifilar. The signal amplitude was then plotted as a function of the DC erase current and/or the head field as shown in FIG. 5. The DC erase current value at the −6 dB signal level equivalent to the coercive force was then determined to be 6.3 milliamperes in this case. Therefore, the value of $a_w$ in Equation 6 is calculated as:

$$a_w = \frac{40\,(2.54)\,(620)\,10^{-6}}{19\,(0.8)(0.0063)\arctan[40/2(19.4 + 2)]}$$

$$a_w = 0.877$$

Figure 6:
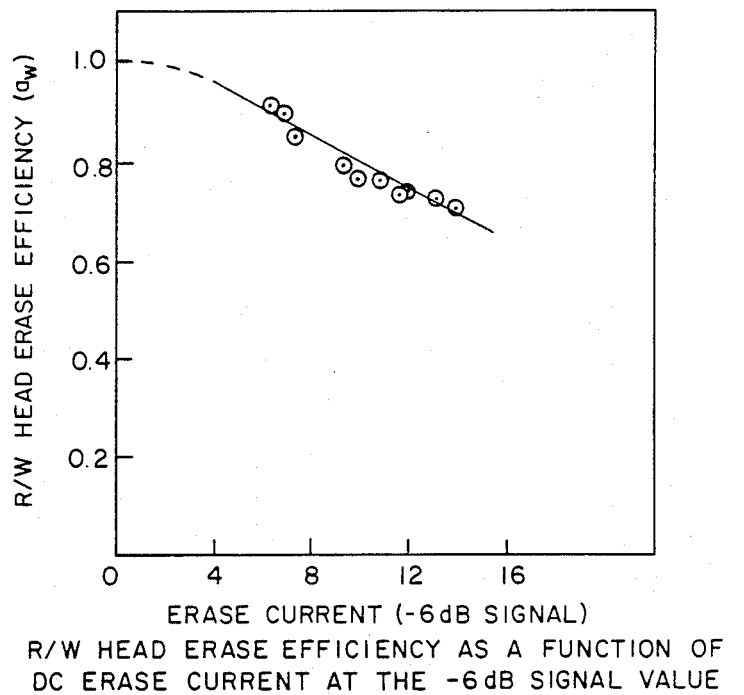
FIG. 6 illustrates R/W head erase efficiency as a function of DC erase current at the −6 dB signal value.

It should be noted that R/W head efficiency $a_w$ during erasure is a function of the DC erase current magnitude when using a 40 microinch gap R/W head. This was determined by utilizing standard discs with known increasing coercive force values, namely from 550 Oe to 967 Oe (Vibrating Sample Magnetometer). The results are shown in FIG. 6. Consequently, when plotting the coercive force vs. the DC erase current at the zero DC erase current value, a coercive force value remains as shown in FIG. 7. This is believed to be due to a non-linear variation in the head core permeability as a function of the write current and/or partial gap saturation at greater DC erase currents. This effect may be eliminated or minimized upon utiization of a large gap R/W head. Therefore, in order to determine accurate values of the coercive force when using a small gap head such as 40 microinches it is desirable to determine the DC erase current (−6 dB signal) and evaluate the efficiency $a_w$ for that particular DC erase current value. The coercive force for that particular DC erase current may then be determined from FIG. 8, where the coercive force versus the write current times efficiency is plotted which is linear and passes through zero coercive force at zero DC erase current. However, in general for a 40 microinch R/W head an efficiency of 0.877 was utilized in the following examples:

1. Evaluation of Coercive Force:

The coercive force of an unknown disc media as a function of circumference (30 degree intervals around the outside track radius) was determined from the −6 dB signal level current value using Equation 6 with an $a_w$ value of 0.877. The R/W gap length was 40μ in (N-19 turns bifilar).

| Angle | Current (−6 dB Signal) | Coercive Force |
|---|---|---|
| 0 | 6.36 ma | 625 |
| 30 | 6.52 | 642 |
| 60 | 6.60 | 649 |
| 90 | 6.62 | 651 |
| 120 | 6.54 | 643 |
| 150 | 6.385 | 628 |
| 180 | 6.18 | 608 |
| 210 | 6.265 | 615 |
| 240 | 6.31 | 621 |
| 270 | 6.145 | 605 |
| 300 | 6.20 | 610 |
| 330 | 6.195 | 609 |

Figure 9:
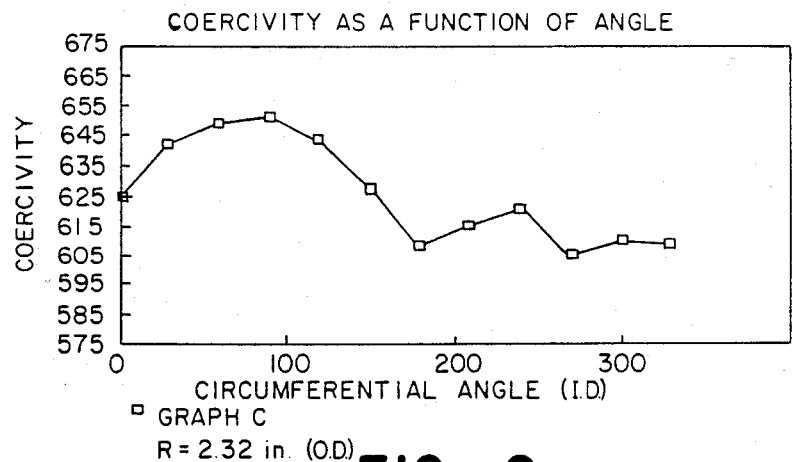
FIG. 9 illustrates coercivity as a function of angle.

The mean coercive force around the track was 625.5 Oe. The maximum coercive force was 651 Oe, whereas the lowest coercive force was 605 Oe. The coercivity range was 46 Oe and the standard deviation was 18 Oe. The coercive force as a function of angle is shown in FIG. 9.

2. Evaluation of the Remanence-Thickness Product:

The isolated half pulse width, Pw50, (freq=500 KHz) of the signal amplitude was then determined as a function of the circumference (90 degree intervals around the outside track radius) and the remanence-thickness product, Mr, was measured 64 utilizing Equation 13 in conjunction with the coercive force as a function of angle as shown above. The results are shown below:

| Angle | Pw50 (microinches) | MrT (emu/cc microinch) |
|---|---|---|
| 0 | 83.6 | 2088 |
| 90 | 82.0 | 1951 |
| 180 | 84.0 | 2085 |
| 270 | 84.0 | 2074.8 |

Figure 10:
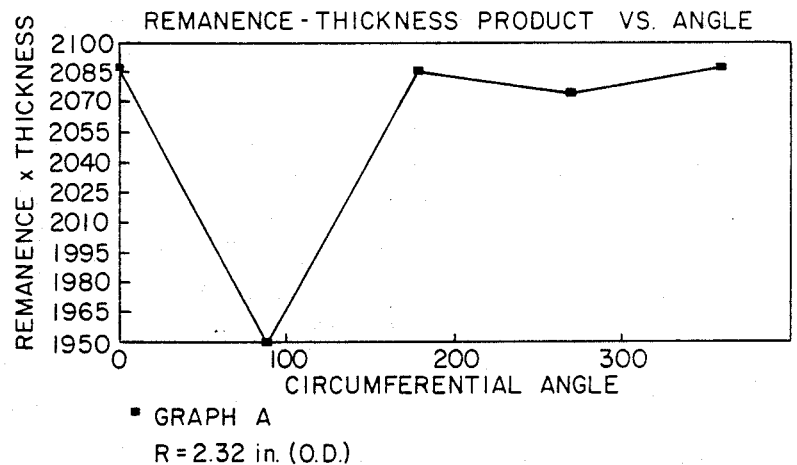
FIG. 10 illustrates remanence-thickness product vs. angle.

Consequently, the mean remanence-thickness product of the media was 2049.7 emu/cc microinch or 2.57 microinch Tesla (2049.7×4×10$^{-6}$). A graph or display of the remanence-thickness product as a function of angle is shown in FIG. 10.

3. Evaluation of the Coercive Force:

The coercive force of an unknown disc media as a function of circumference (30 degree intervals) on the outside track radius (r=2.32") and the inside track radius (r=1.32") was determined utilizing a R/W head with a gap of 40 microinches flying at the outside track radius at 23 microinches and 16 microinches on the inside track radius. The number of turns was 19 bifilar. The coercive force was determined on the basis of Equation 6 as illustrated in Example 1; i.e., utilizing an $a_w$ value of 0.877. The results are shown in the table below where $I_{DC}$ is the DC erase current in milliamperes (at the −6 dB signal level) and Hc is the corresponding coercive force value.

| Angle | $I_{DC}$ (OD) | Hc (OD) | $I_{DC}$ (ID) | Hc (ID) |
| --- | --- | --- | --- | --- |
| 0 | 8.193 | 672 | 6.693 | 669 |
| 30 | 8.307 | 682 | 6.808 | 680 |
| 60 | 8.396 | 687 | 6.919 | 691 |
| 90 | 8.327 | 684 | 6.862 | 685 |
| 120 | 8.219 | 675 | 6.732 | 672 |
| 150 | 8.169 | 670 | 6.720 | 671 |
| 180 | 8.112 | 666 | 6.757 | 675 |
| 210 | 8.034 | 659 | 6.771 | 676 |
| 240 | 8.11 | 666 | 6.872 | 686 |
| 270 | 7.964 | 654 | 6.804 | 680 |
| 300 | 8.069 | 663 | 6.842 | 684 |
| 330 | 8.136 | 668 | 6.570 | 656 |

Figure 11:
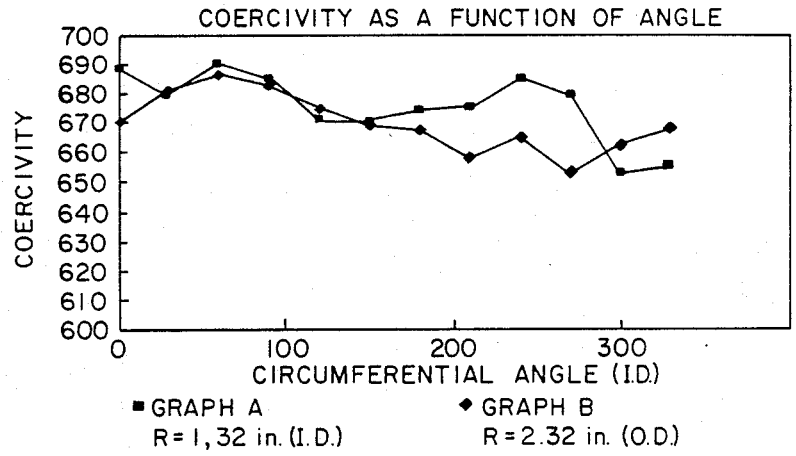
FIG. 11 illustrates coercivity as a function of angle.

Consequently, the mean coercivity at the inside track radius was 677 Oe, the maximum coercive force was 691 Oe and the minimum coercive force was 656 Oe (a range of 35 Oe). These results are shown in FIG. 11.

The calculated values are especially useful in modifying the manufacturing process for magnetic discs. Currently, manufacturing must rely on the recording performance to monitor progress and/or adjust signal process parameters to conform to recording specifications in the absence of destructive testing such as provided by the known test systems. Typically, if recording performance is used, the signal amplitude at high frequency is utilized to adjust manufacturing process parameters. However, signal amplitudes at high frequencies are a complex function of remanence (Mr), coercive force (Hc), and thickness of the magnetic media (T). Therefore, the question becomes whether to adjust Mr (polishing), Hc (Cr thickness), temperature, etc. or T (time power). The thickness can be conveniently monitored by X-ray fluorescence; but, to determine whether oo adjust Mr or Hc, additional information is required which specifies Hc independently of Mr.

Two additional recording parameters which should be determined and which aid in the monitoring of the disc development process are the isolated signal half pulse width (Pw50) and the optimum write current (Iw).

Figure 12:
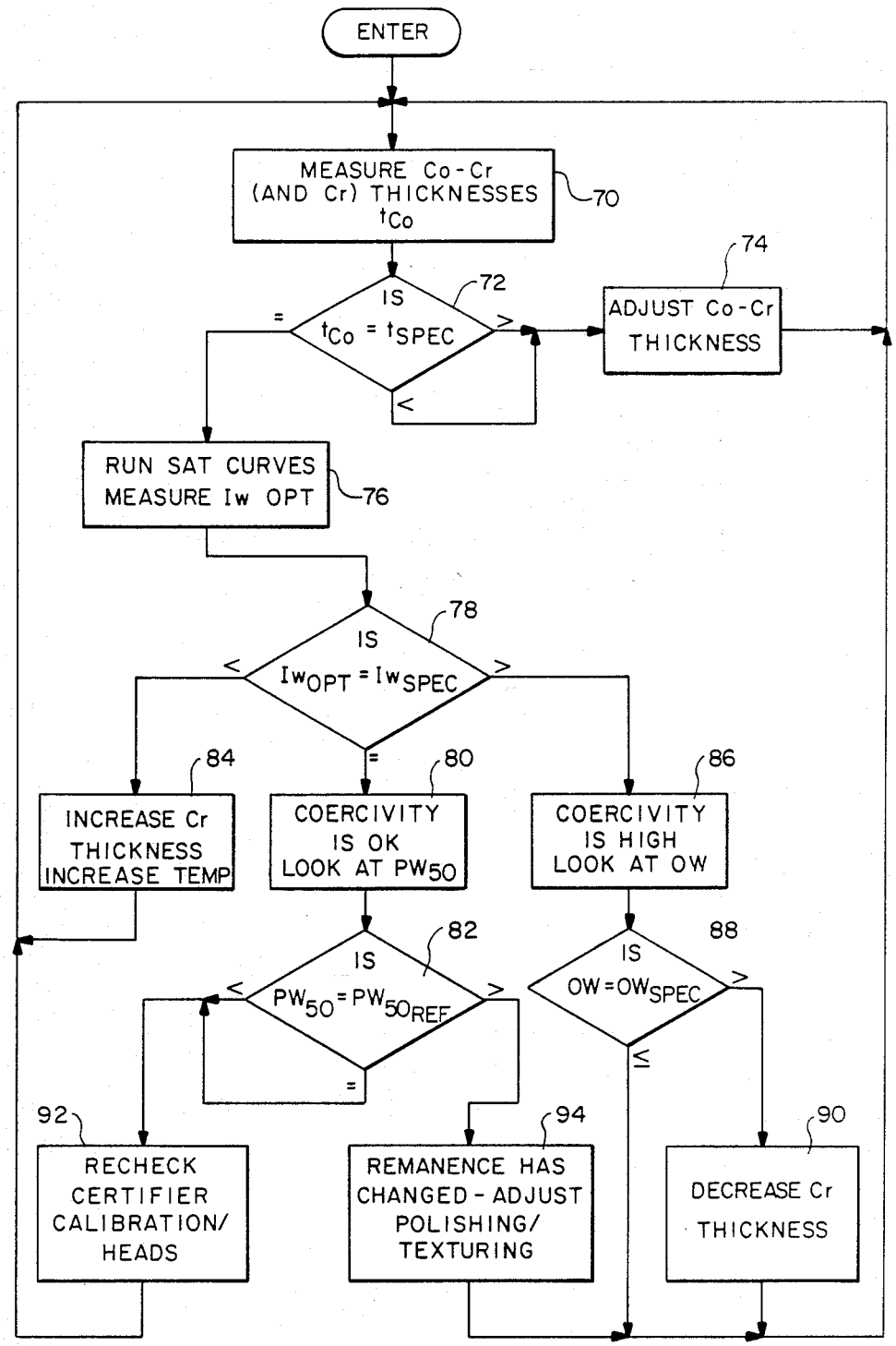
FIG. 12 is a flow chart of the manufacturing process steps controlled by the present invention.

The calculation of these values have been shown above. The optimum write current(predetermined at minimum write current for maximum 2f signal amplitude) is independent of Mr and directly dependent on Hc and indirectly on T for a given read/write head and spacing. Consequently, variation in Iw corresponds to a variation of Hc for a known thickness. If the value of Iw is constant but Pw50 varies, then only Mr need be modified. Therefore, by monitoring and comparing signal amplitude, Pw50, Iw, and thickness, it can be determined whether Mr or Hc require adjusting. A procedure for evaluation and estimation of the magnetic properties and making the necessary adjustments to optimize a sputtered disc output is shown in FIG. 12. The monitoring process first measures in this case the Co-Cr magnetic thickness 70. To the extent there is a variation from specification 72, the thickness (generally by deposition time) may be adjusted 74. If the thickness specification is met, then the minus 6 dB Signal amplitude is determined at a specific DC erase current I DC 76 which then allows determination of the coercive force. If Hc is less than or greater than Hc spec., then adjust process parameters 80, 82. If the coercive force meets specification 78, the Isolated Half Pulse Width is measured 84. From the Isolated Half Pulse Width (PW 50) the remanence-thickness product (MrT) may be determined or Mr may be determined since the thickness is known. If the MrT product or Mr is greater or less than specification 86, then the remanence or Mr has changed and the polish/texture of the disc surface must be re-evaluated 88. If the MrT product or Mr meets specification, then the sputtering system or disc process is satisfactory and discs are then certified 90.

With these adjustments in the process, a consistent output without destructive testing of the magnetic recording media can be achieved. Consistent testing of large numbers of the magnetic discs can be achieved as well.

While the invention has been described in detail with reference to specific embodiments thereof, it will be apparent to one skilled in the art that various changes and modifications can be made therein without departing from the spirit and scope of the invention. In particular, a greater gap length R/W head may be used to measure the coercive force distribution and/or remanence-thickness product of the recording member. It is to be understood that the following claims are intended to cover all the generic and specific features of the invention herein described and all statements of the scope of the invention which might be said to fall therebetween.

What is claimed:

1. A method of measuring coercivity of a rotatable magnetic disc in a magnetic storage device said rotatable magnetic storage disc having a plurality of data recording tracks thereon to define data recording locations, said storage device further comprising a read/write head selectively positionable over said data recording locations for recording, accessing and erasing data in said locations, said measuring method comprising the steps of recording signals in a plurality of said data recording locations on said disc, applying a DC erase field sufficient to erase the recorded signal at one of said recording locations, measuring the magnitude of the DC erase field required to reduce the recorded signal at said one recording location by 50% (6 db), and calculating the coercivity of the disc as a function of the measured DC erase field.

2. A method as in claim 1 wherein the coercivity Hx is calculated as a function of the relationship $$Hx = \frac{0.8 NiAw}{g \arctan(g/2y)}$$

where i is the current in amperes passed through said read/write head to erase said recorded data by 50% (6 db);

N is the number of turns on said head;

g is the length of a gap in said head used to record said data;

Aw is the efficiency of said read/write head;

y is the distance below the head at which an effective coercive force is to be measured; and Hx is the coercive field in oersteds.

3. A method as in claim 2 wherein y is selected to be the sum of the distance from the head to the surface of the disc plus ½ of the thickness of the disc recording member.

4. A method as in claim 2 including the steps of positioning said head over said data recording location on said disc, measuring a field induced in said head by polarizing magnetic domains in said disc representing the data stored at said location, storing said measured induced field as an initial field, carrying out said steps of applying a DC erase field and measuring the induced signal until the measured induced signal is one-half said initial signal, the coercive force Hx being the applied erase field necessary to carry out the one-half reduction in said signal amplitude.

5. A method as in claim 4 including the steps of applying said DC erase field in measurably increased levels, measuring and storing the readback signal to said head, increasing said DC erase field until said readback signal is substantially 50% of the initial amplitude.

6. A method as in claim 5 wherein said increments of change in the DC erase field are about 50 oersteds.

7. A method as in claim 6 including the step of interpolating between data points bracketing said 50% readback level, whereby a resolution of much less than 50 oersteds is achieved.

8. A method as in claim 5 including carrying out the steps leading to detection of said 50% amplitude reduction at a plurality of said data recording locations on said disc.

9. A system for determining magnetic characteristics of a magnetic media member at various known coordinate positions of the media comprising means for applying a write current through a gap of a recording head for recording a sequence of isolated magnetic transitions at said known coordinate positions, a means for applying a DC erase field at said known recorded coordinate positions by sourcing an amount of current through said head as determined by the relationship $$H_x = \frac{0.8\, N I\, aw}{g} \arctan \frac{g}{2y}$$

a means for measuring a resulting readback signal following said recording and erasing steps at said coordinate positions, means for increasing the applied DC erase field by incremental amounts whereafter the recording and erasing means are again activated, means for plotting the relationship of said signal readback and applied field, and means for analyzing said relationship of signal readback and applied field to select a point representing 50% loss in signal value at any one of said coordinate positions as defining coercivity of said media.

10. A system as in claim 9 including means responsive to said plotting means for selecting a DC erase current at a $-6$ dB value of said readback signal, and means for calculating coercive force based on said readback signal.

11. A system as in claim 9 including means responsive to said plotting means for selecting a half pulse width value, and a means for operating on said half pulse width value to calculate the remanence-thickness product of the magnetic media.

12. A method as in claim 2 including the steps of selecting a half pulse width value based on said calculated value of Hx, and operating on said half pulse width value to calculate the remanence-thickness product of said magnetic media.

13. A method as in claim 13 wherein
Pw 50 (pulse width) = velocity (Ap/Ep$\pi$)
Ap = area beneath an isolated transition pulse;
Ep = maximum amplitude of the isolated pulse.

* * * * *